United States Patent
Tabei et al.

(10) Patent No.: US 11,469,718 B2
(45) Date of Patent: Oct. 11, 2022

(54) AMPLIFIER CIRCUIT

(71) Applicant: Murata Manufacturing Co., Ltd., Kyoto (JP)

(72) Inventors: Makoto Tabei, Kyoto (JP); Ken Wakaki, Kyoto (JP); Masamichi Tokuda, Kyoto (JP); Daisuke Watanabe, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 63 days.

(21) Appl. No.: 17/078,189

(22) Filed: Oct. 23, 2020

(65) Prior Publication Data

US 2021/0058040 A1 Feb. 25, 2021

Related U.S. Application Data

(63) Continuation of application No. PCT/JP2019/016573, filed on Apr. 18, 2019.

(30) Foreign Application Priority Data

Apr. 26, 2018 (JP) .............................. JP2018-085841

(51) Int. Cl.
*H03F 3/191* (2006.01)
*H03F 1/52* (2006.01)
(Continued)

(52) U.S. Cl.
CPC ............... *H03F 1/523* (2013.01); *H03F 1/56* (2013.01); *H03F 3/193* (2013.01);
(Continued)

(58) Field of Classification Search
CPC ................................... H03F 1/52; H03F 3/191
(Continued)

(56) References Cited

U.S. PATENT DOCUMENTS 4,287,479 A * 9/1981 Jensen ...................... H03F 1/48
330/294
4,835,485 A * 5/1989 Mueller ............. G01R 33/3621
330/277
(Continued)

FOREIGN PATENT DOCUMENTS

| JP | 2003-243512 A | 8/2003 |
| JP | 2003-274553 A | 9/2003 |
| JP | 2013-110645 A | 6/2013 |

OTHER PUBLICATIONS

International Search Report for PCT/JP2019/016573 dated Jul. 9, 2019.
Written Opinion for PCT/JP2019/016573 dated Jul. 9, 2019.

*Primary Examiner* — Henry Choe
(74) *Attorney, Agent, or Firm* — Pearne & Gordon LLP

(57) ABSTRACT

An amplifier circuit amplifies a radio-frequency signal. The amplifier circuit includes an amplifier, an input matching circuit connected to an input side of the amplifier and matches impedance, and a protection circuit connected to a node in a path within a path between an input matching circuit and the amplifier. The protection circuit includes a first diode connected between the node and a ground, and a second diode connected in parallel with the first diode and connected in a direction opposite to the first diode between the node and the ground. A threshold voltage of each of the first diode and the second diode is greater than a maximum voltage amplitude of the input signal at the node and is less than a difference between a withstand voltage of the amplifier and the bias voltage.

14 Claims, 5 Drawing Sheets

(51) Int. Cl.
*H03F 1/56* (2006.01)
*H03F 3/193* (2006.01)
(52) U.S. Cl.
CPC .. *H03F 2200/222* (2013.01); *H03F 2200/387* (2013.01); *H03F 2200/426* (2013.01); *H03F 2200/451* (2013.01)
(58) Field of Classification Search
USPC .......................................... 330/298, 302, 305
See application file for complete search history.

(56) References Cited

U.S. PATENT DOCUMENTS

| | | | |
|---|---|---|---|
| 7,557,654 B2* | 7/2009 | Noto | H03F 1/3223 330/149 |
| 2003/0139159 A1* | 7/2003 | Young | H04B 1/0458 455/217 |
| 2003/0151865 A1 | 8/2003 | Maio | |
| 2013/0127544 A1* | 5/2013 | Murakami | H03F 1/523 330/296 |

* cited by examiner

AMPLIFIER CIRCUIT

CROSS REFERENCE TO RELATED APPLICATION

This is a continuation of International Application No. PCT/JP2019/016573 filed on Apr. 18, 2019 which claims priority from Japanese Patent Application No. 2018-085841 filed on Apr. 26, 2018. The contents of these applications are incorporated herein by reference in their entireties.

BACKGROUND

Technical Field

The present disclosure relates to an amplifier circuit that amplifies a radio-frequency signal.

Hitherto, amplifier circuits that amplify a radio-frequency signal are known (see, for example, Patent Document 1). An amplifier circuit described in Patent Document 1 includes an amplifier made up of a transistor and the like and a protection circuit in which two diode-connected transistors connected in parallel with each other in opposite directions. In the amplifier circuit described in Patent Document 1, when an overvoltage is applied to the amplifier circuit, a voltage higher than or equal to a threshold voltage of any one of the two transistors is applied to the protection circuit. Thus, any one of the two transistors is made electrically continuous to attempt to avoid application of an overvoltage to the amplifier. In other words, in the amplifier circuit described in Patent Document 1, when an overvoltage higher than the withstand voltage of the transistor that makes up the amplifier is applied, an input voltage is lowered by using the protection circuit to reduce breakage of the transistor.

Patent Document 1: Japanese Unexamined Patent Application Publication No. 2003-243512

BRIEF SUMMARY

In the amplifier circuit described in Patent Document 1, the two transistors of the protection circuit are formed in the same production process as the transistor that makes up the amplifier. For this reason, the two transistors of the protection circuit are formed so as to have threshold voltages higher than that of the transistor that makes up the amplifier; however, a difference in threshold voltage between the two transistors of the protection circuit and the transistor that makes up the amplifier is relatively small.

Here, as described in Patent Document 1, when the protection circuit is connected in a path to which a bias voltage to be applied to the amplifier is applied, there are concerns that, even when the voltage of a signal to be applied to the amplifier is sufficiently lower than the withstand voltage of the transistor that makes up the amplifier, the protection circuit operates and, as a result, a distortion occurs in the waveform of a radio-frequency signal to be input to the amplifier, and a distortion also occurs in an output signal of the amplifier. This is because the bias voltage is set to be higher than or equal to the threshold voltage of the transistor that makes up the amplifier and is, therefore, a voltage close to the threshold voltage of each of the transistors that make up the protection circuit. During operation of the amplifier circuit, the sum of such a bias voltage and the voltage of a radio-frequency signal to be amplified by the amplifier circuit is applied to the two transistors of the protection circuit, so, even when no overvoltage is applied to the amplifier circuit as well, a voltage higher than or equal to the threshold voltage of each of the transistors of the protection circuit can be applied to the protection circuit. For this reason, even when the sum of a bias voltage to be applied to the amplifier circuit and a maximum voltage of a radio-frequency signal (that is, the voltage of a signal to be input to the amplifier) is sufficiently lower than the withstand voltage of the transistor that makes up the amplifier, the maximum voltage of the radio-frequency signal can be reduced as a result of operation of the protection circuit.

Even in a case where the protection circuit is connected to a path to which a bias voltage to be applied to the amplifier is not applied, when the threshold voltage of each of the transistors that make up the protection circuit is lower than the maximum voltage of a signal to be input to the amplifier, there are concerns that the protection circuit operates at a low voltage and, as a result, a distortion occurs in an output signal of the amplifier.

The present disclosure provides an amplifier circuit capable of protecting an amplifier from overvoltage and reducing a distortion of an input signal.

An amplifier circuit according to an aspect of the present disclosure is an amplifier circuit that amplifies an input signal that is a radio-frequency signal. The amplifier circuit includes an amplifier to which the input signal and a bias voltage are applied, an input matching circuit that is connected to an input side of the amplifier and that matches impedance, and a protection circuit that is connected to a node in a path, to which the bias voltage is not applied, within a path between the input matching circuit and the amplifier. The protection circuit includes a first diode that is connected between the node and a ground, and a second diode that is connected in parallel with the first diode and connected in a direction opposite to the first diode between the node and the ground. A threshold voltage of each of the first diode and the second diode is greater than a maximum voltage amplitude of the input signal at the node and is less than a difference between a withstand voltage of the amplifier and the bias voltage.

An amplifier circuit according to another aspect of the present disclosure is an amplifier circuit that amplifies an input signal that is a radio-frequency signal. The amplifier circuit includes an amplifier to which the input signal and a bias voltage are applied, an input matching circuit that is connected to an input side of the amplifier and that matches impedance, and a protection circuit that is connected to a node in a path, to which the bias voltage is applied, within a path between the input matching circuit and the amplifier. The protection circuit includes a first diode that is connected between the node and a ground and that has a direction from the node to the ground as a forward direction, and a second diode that is connected in parallel with the first diode and connected in a direction opposite to the first diode between the node and the ground. A threshold voltage of the first diode is greater than a sum of a maximum voltage amplitude of the input signal at the node and the bias voltage and is less than a withstand voltage of the amplifier.

According to the present disclosure, it is possible to provide an amplifier circuit capable of protecting an amplifier from overvoltage and reducing a distortion of an input signal.

DETAILED DESCRIPTION

Figure 1:
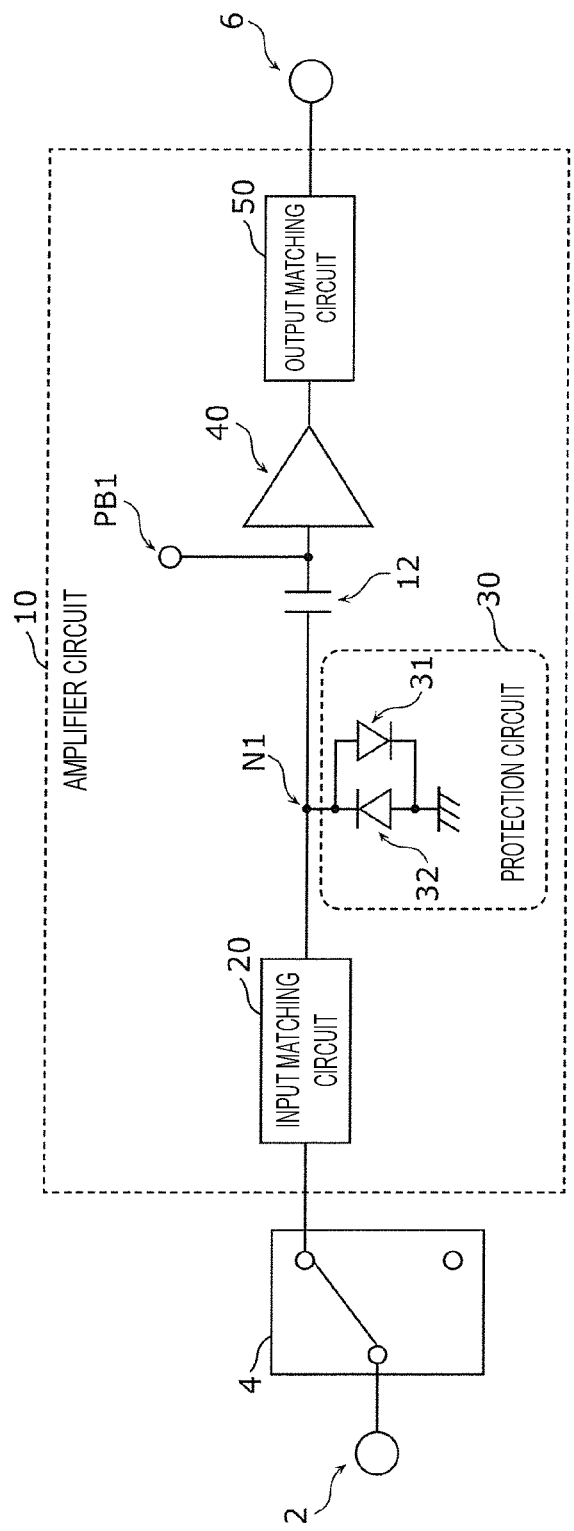
FIG. 1 is a schematic circuit diagram illustrating the configuration of an amplifier circuit according to a first embodiment.

Hereinafter, embodiments of the present disclosure will be described in detail with reference to examples and drawings. All the embodiments that will be described below are general or specific examples. Numeric values, shapes, materials, elements, disposition and connection modes of the elements, and the like, that will be described below are illustrative and are not intended to limit the present disclosure. Of the elements in the following embodiments, the elements not included in the independent claims will be described as optional elements. In addition, the size or size ratio of elements shown in the drawings is not necessarily strict. In the drawings, like reference numerals denote substantially identical components, and the overlap description may be omitted or simplified. In an electric circuit described below, a state represented by the word "connected" includes not only a directly connected state but also an indirectly connected state via another element or the like.

First Embodiment

[1-1. General Configuration]

The configuration of an amplifier circuit according to a first embodiment will be described with reference to FIG. 1. FIG. 1 is a schematic circuit diagram illustrating the configuration of an amplifier circuit 10 according to the present embodiment. In addition to the amplifier circuit 10, FIG. 1 shows an input terminal 2 to which an input signal to the amplifier circuit 10 is applied, a switch 4 that switches a destination to which the input signal is applied, and an output terminal 6 from which an output signal of the amplifier circuit 10 is output. For example, an antenna is connected to the input terminal 2, and a radio-frequency signal received by the antenna is applied to the input terminal 2.

The amplifier circuit 10 is a circuit that amplifies an input signal that is a radio-frequency signal. As shown in FIG. 1, the amplifier circuit 10 includes an input matching circuit 20, a protection circuit 30, an amplifier 40, and an output matching circuit 50. The amplifier circuit 10 further includes a capacitor 12.

The amplifier 40 is a circuit to which an input signal and a bias voltage are applied and that amplifies the input signal. In the present embodiment, the amplifier 40 is a low noise amplifier including one or more amplifier transistors. A configuration example of the amplifier 40 will be described in detail later.

The input matching circuit 20 is a circuit that is connected to an input side of the amplifier 40 and that matches impedance. In the present embodiment, the input matching circuit 20 is connected between one of selection terminals of the switch 4 and a node N1 to which the protection circuit 30 is connected. The input matching circuit 20 is a circuit that matches the impedance of a path on the input terminal 2 side with the impedance of a path on the input side of the amplifier 40, that is, the input impedance of the amplifier 40 within a path in which the input matching circuit 20 is provided.

The protection circuit 30 is a circuit connected to the node N1 in a path between the input matching circuit 20 and the amplifier 40, and reduces application of an overvoltage to the amplifier 40. In the present embodiment, the protection circuit 30 is connected to the node N1 in a path, to which the bias voltage is not applied, within the path between the input matching circuit 20 and the amplifier 40. The protection circuit 30 includes a first diode 31 of which the anode is connected to the node N1, and a second diode 32 of which the cathode is connected to the node N1 and that is connected in parallel with the first diode 31. In the present embodiment, the cathode of the first diode 31 and the anode of the second diode 32 are connected to a ground. In other words, the first diode 31 is a diode that is connected between the node N1 and the ground and that has a direction from the node N1 toward the ground as a forward direction. The second diode 32 is a diode that is connected in parallel with the first diode in a direction opposite to the first diode between the node N1 and the ground. In other words, in the amplifier circuit 10, the first diode 31 is a diode connected such that current flows from the node N1 toward the ground, and the second diode 32 is a diode connected such that current flows from the ground toward the node N1.

The first diode 31 and the second diode 32 are rectifier elements. In the present embodiment, each of the first diode 31 and the second diode 32 is a diode element, that is, a two-terminal diode having two terminals, that is, the anode and the cathode. Alternatively, a diode-connected transistor may be used instead of a two-terminal diode. In other words, each of the first diode 31 and the second diode 32 may be a three-terminal diode having three terminals, that is, a gate, a drain, and a source (or a base, a collector, and an emitter). When each of the first diode 31 and the second diode 32 is a diode-connected transistor, terminals corresponding to the anode and cathode of the diode among the terminals of the diode-connected transistor are respectively called anode and cathode. For example, when an n-type field effect transistor (FET) is used as the first diode 31 or the second diode 32, the drain terminal and gate terminal of the diode-connected transistor are called anode, and the source terminal is called cathode.

A threshold voltage of each of the first diode 31 and the second diode 32 is greater than a maximum voltage amplitude of an input signal at the node N1. Here, the threshold voltage is a minimum application voltage for making a diode continuous when a voltage is applied in the forward direction of the diode. The threshold voltage of a two-terminal diode corresponds to a so-called forward voltage. The maximum voltage amplitude of an input signal means an estimated maximum value as the voltage amplitude of the input signal within the range of normal operation of the amplifier circuit 10. An input signal within the range of normal operation of the amplifier circuit 10 does not include an input signal containing a noise component, such as a surge voltage, an input signal that is not assumed to be amplified in the amplifier circuit 10, or the like.

The threshold voltage of each of the first diode 31 and the second diode 32 may be determined so as to be capable of reducing application of a voltage higher than the withstand voltage of the amplifier 40 to the amplifier 40. For example, the threshold voltage of each of the first diode 31 and the second diode 32 may be a voltage lower than a voltage obtained by subtracting the bias voltage from the withstand voltage of the amplifier 40. The withstand voltage of the amplifier 40 may be defined by, for example, the withstand voltage of the amplifier transistor closest to the input terminal of the amplifier 40 among the one or more amplifier transistors of the amplifier 40.

In the present embodiment, the first diode 31 and the second diode 32 are each a two-terminal diode containing silicon as a semiconductor material and each has a threshold voltage of 0.7 V.

The output matching circuit 50 is a circuit that is connected to an output side of the amplifier 40 and that matches impedance. In the present embodiment, the output matching circuit 50 is connected between the amplifier 40 and the output terminal 6. The output matching circuit 50 is a circuit that matches the impedance of a path on the output side of the amplifier 40 with the impedance of a path on the output terminal 6 side within a path in which the output matching circuit 50 is provided. The output matching circuit 50 may be provided outside the amplifier circuit 10.

The capacitor 12 is a capacitive element that conducts the alternating-current component of a voltage that is applied to a path in which the capacitor 12 is provided in the amplifier circuit 10 and that interrupts the direct-current component of the voltage. In the present embodiment, the capacitor 12 interrupts application of the bias voltage, to be applied to the amplifier 40, to the input terminal 2 side. On the other hand, the capacitor 12 conducts the radio frequency components of the input signal applied to the input terminal 2, to the amplifier 40. In the present embodiment, the bias voltage is applied to a terminal PB1 connected between the capacitor 12 and the amplifier 40. Thus, it is possible to input the bias voltage to the amplifier 40 and reduce application of the bias voltage to the path on the input terminal 2 side with respect to the capacitor 12.

[1-2. Configuration of Amplifier]

Figure 2:
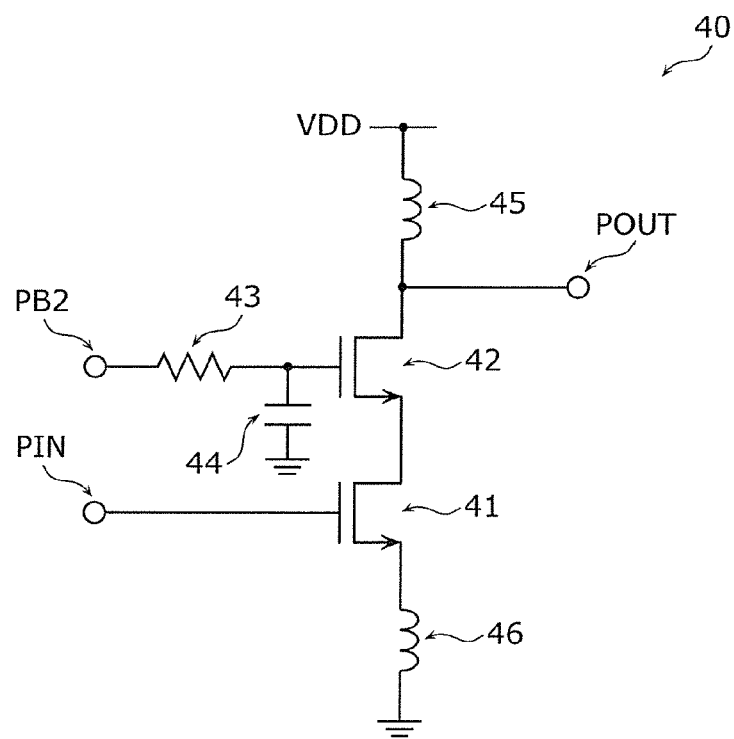
FIG. 2 is a circuit diagram illustrating an example of the configuration of an amplifier according to the first embodiment 1.

A configuration example of the amplifier 40 according to the present embodiment will be described with reference to FIG. 2. FIG. 2 is a circuit diagram illustrating an example of the configuration of the amplifier 40 according to the present embodiment. As shown in FIG. 2, the amplifier 40 has an amplifier input terminal PIN and an amplifier output terminal POUT. The amplifier input terminal PIN is an input terminal to which an input signal is applied. In the amplifier 40, not only the input signal but also the bias voltage to be applied to the terminal PB1 shown in FIG. 1 is applied to the amplifier input terminal PIN. The amplifier output terminal POUT is an output terminal from which an input signal amplified by the amplifier 40 is output. The amplifier 40 has a terminal PB2 to which the bias voltage is applied. The amplifier 40 has one or more amplifier transistors. In the present embodiment, the amplifier 40 includes amplifier transistors 41, 42. The amplifier 40 further includes a resistance 43, a capacitor 44, and inductors 45, 46.

The amplifier transistor 41 is the amplifier transistor closest to the amplifier input terminal PIN among the one or more amplifier transistors of the amplifier 40. The amplifier transistor 41 is a transistor having a source terminal, a drain terminal, and a gate terminal and is, for example, an n-type FET. In the present embodiment, the amplifier transistor 41 is a MOSFET (metal-oxide semiconductor field-effect transistor).

The gate terminal and drain terminal of the amplifier transistor 41 are respectively connected to the amplifier input terminal PIN and the source terminal of the amplifier transistor 42. The source terminal of the amplifier transistor 41 is connected to the ground via the inductor 46.

The amplifier transistor 42 is a transistor having a source terminal, a drain terminal, and a gate terminal and is, for example, an n-type FET. In the present embodiment, the amplifier transistor 42 is a MOSFET.

The amplifier transistors 41, 42, each is not limited to an n-type FET and may be a p-type FET or a bipolar transistor.

The gate terminal of the amplifier transistor 42 is grounded for radio frequency via the capacitor 44 and connected to the terminal PB2 via the resistance 43. The drain terminal of the amplifier transistor 42 is connected to the amplifier output terminal POUT and is connected to the inductor 45.

The amplifier transistors 41, 42 both may be produced in the same production process. Thus, it is possible to simplify production of the amplifier 40. The amplifier transistors 41, 42, each may contain, for example, silicon as a semiconductor material. In this case, the threshold voltage of each of the amplifier transistors 41, 42 is, for example, about 0.3 V.

The resistance 43 is a resistive component of a path between the terminal PB2 and the gate terminal of the amplifier transistor 42.

The inductor 45 is an inductance element connected to the amplifier transistor 42. The inductor 45 is a matching element for performing impedance matching between the amplifier transistors 41, 42 and an external connection circuit and is also a choke element that blocks flow of a radio-frequency signal to a direct-current power supply side (that is, a direct-current voltage VDD feeding circuit side). One terminal of the inductor 45 is connected to the drain terminal of the amplifier transistor 42, the other terminal is connected to the direct-current power supply, and the direct-current voltage VDD is applied.

The inductor 46 is an inductance element serially disposed in a path connecting the source terminal of the amplifier transistor 41 and the ground and is a source degeneration inductor. The inductor 45 may be replaced with another choke element, such as a resistance. The resistance 43 and the inductor 46 are not indispensable components of the amplifier 40 according to the present embodiment.

[1-3. Operation and Advantageous Effects]

The operation and advantageous effects of the amplifier circuit 10 according to the present embodiment will be described below.

In the present embodiment, the protection circuit 30 is connected to the node N1 in the path to which the bias voltage is not applied, that is, the node N1 to which the input signal is applied and the bias voltage is not applied, and the threshold voltage of each of the first diode 31 and the second diode 32 is greater than the maximum voltage amplitude of the input signal at the node N1. Thus, when a voltage less than or equal to the maximum voltage amplitude of the input signal is applied to the protection circuit 30, the first diode 31 and the second diode 32 of the protection circuit 30 do not conduct. Therefore, when an overvoltage is not applied, the voltage of the input signal is not reduced by the protection circuit 30. In other words, with the amplifier circuit according to the present embodiment, it is possible to reduce a distortion of the input signal as compared to the amplifier circuit described in, for example, Patent Document 1. On the other hand, when an overvoltage higher than or equal to the threshold voltage of each of the first diode 31 and the second diode 32 is applied to the amplifier circuit, it is possible to reduce the overvoltage applied to the amplifier 40 by conduction of the first diode 31 or the second diode 32.

The threshold voltage of each of the first diode 31 and the second diode 32 is less than the difference between the withstand voltage of the amplifier 40 and the bias voltage. Thus, the sum of the overvoltage reduced by the protection circuit 30 and the bias voltage can be made constantly lower than the withstand voltage of the amplifier 40. Therefore, it is possible to reliably protect the amplifier from overvoltage.

Figure 3:
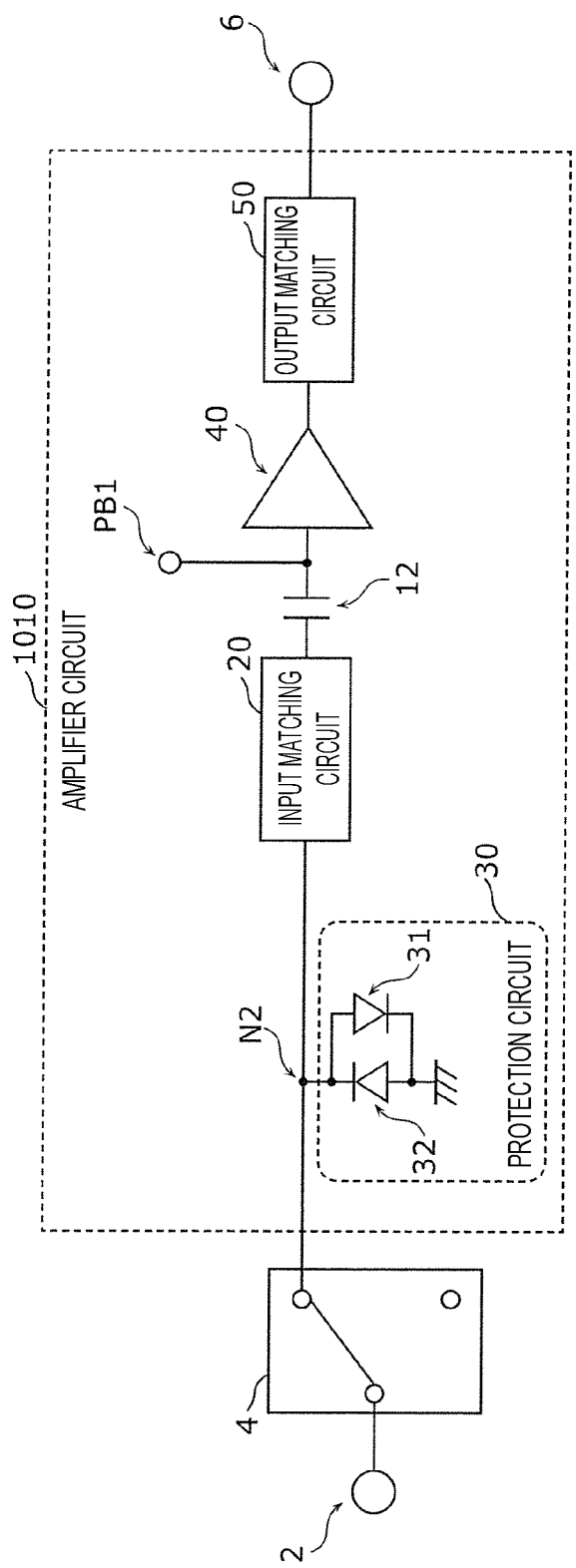
FIG. 3 is a schematic circuit diagram illustrating the configuration of an amplifier circuit according to a comparative example.

In the amplifier circuit 10 according to the present embodiment, the protection circuit 30 is connected to the node N1 in the path between the input matching circuit 20 and the amplifier 40. An advantageous effect due to the connection position of the protection circuit 30 will be described with reference to the drawings while making comparison with a comparative example. FIG. 3 is a schematic circuit diagram illustrating the configuration of an amplifier circuit 1010 according to the comparative example. As shown in FIG. 3, the amplifier circuit 1010 according to the present comparative example, as well as the amplifier circuit 10 according to the present embodiment, includes the input matching circuit 20, the protection circuit 30, the amplifier 40, and the output matching circuit 50. FIG. 3, as well as FIG. 1, shows the input terminal 2, the switch 4, and the output terminal 6 together with the amplifier circuit 1010.

As shown in FIG. 3, the amplifier circuit 1010 according to the comparative example differs from the amplifier circuit 10 according to the present embodiment in that the protection circuit 30 is connected to a node N2 on the input terminal 2 side with respect to the input matching circuit 20 and is the same in the other points.

Figure 4:
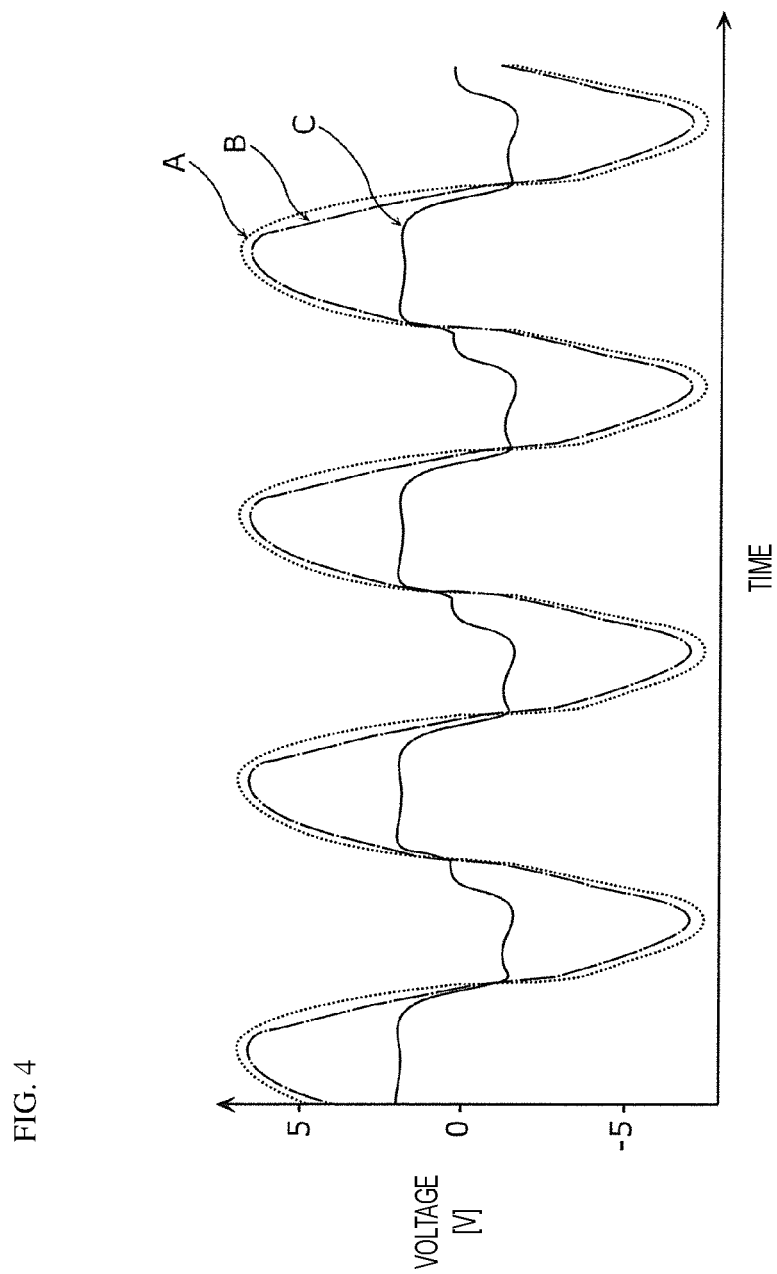
FIG. 4 is a graph illustrating the voltage waveform of an input signal applied to the amplifier of the amplifier circuit according to the first embodiment and the voltage waveform of an input signal applied to the amplifier of the amplifier circuit according to the comparative example.

Hereinafter, simulation results of the operations of the amplifier circuit 10 according to the present embodiment and the amplifier circuit 1010 according to the comparative example will be described with reference to FIG. 4. FIG. 4 is a graph illustrating the voltage waveform of an input signal applied to the amplifier 40 of the amplifier circuit 10 according to the present embodiment and the voltage waveform of an input signal applied to the amplifier 40 of the amplifier circuit 1010 according to the comparative example. FIG. 4 shows a voltage waveform that is applied to the amplifier input terminal PIN of the amplifier 40 when the input signal is applied to the input terminal 2 of the circuit shown in FIG. 1 or FIG. 3. The voltage waveform is obtained by simulation. A curve C represented by the continuous line in FIG. 4 shows a voltage waveform that is applied to the amplifier 40 in the case of the amplifier circuit 10 according to the present embodiment. A curve A represented by the dotted line in FIG. 4 shows a voltage waveform that is applied to the amplifier 40 when the protection circuit 30 is removed from the amplifier circuit 10 according to the present embodiment. A curve B represented by the alternate long and short dashed line shows a voltage waveform that is applied to the amplifier 40 in the case of the amplifier circuit 1010 according to the comparative example.

As represented by the curve A in FIG. 4, when no protection circuit 30 is provided, a voltage up to over 5 V is applied to the amplifier 40. On the other hand, as represented by the curve C in FIG. 4, in the amplifier circuit 10 according to the present embodiment, an input voltage to the amplifier 40 is suppressed to about up to 2 V by the protection circuit 30. In this way, with the amplifier circuit 10 according to the present embodiment, it is possible to protect the amplifier 40 from overvoltage. As represented by the curve B in FIG. 4, even when the protection circuit 30 is provided but the protection circuit 30 is connected to the input terminal 2 side with respect to the input matching circuit 20, it is possible to suppress almost no input voltage to the amplifier 40. Hereinafter, the simulation results will be described in detail. The impedance significantly varies between a path on the input side of the input matching circuit 20 and a path on the output side of the input matching circuit 20. In the path on the input terminal 2 side with respect to the input matching circuit 20, the impedance is about 50Ω; however, in the path on the amplifier 40 side with respect to the input matching circuit 20, the impedance is higher than 50Ω. Therefore, the voltage of the input signal on the amplifier 40 side with respect to the input matching circuit 20 is higher than the voltage of the input signal on the input terminal 2 side with respect to the input matching circuit 20. Therefore, even when the protection circuit 30 including the first diode 31 and the second diode 32 each having a threshold voltage of about 0.7 V is connected to the input terminal 2 side with respect to the input matching circuit 20, a voltage to be applied to the amplifier 40 can exceed 5 V. In other words, with the amplifier circuit 1010 according to the comparative example, it is not possible to sufficiently protect the amplifier 40 from overvoltage. In this way, the voltage of the input signal can change in accordance with a position in the path. Therefore, when the protection circuit 30 is connected to the node N1 in the path between the input matching circuit 20 and the amplifier 40, it is possible to further reliably protect the amplifier 40 from overvoltage.

In the amplifier circuit 10 according to the present embodiment, the protection circuit 30 is connected to the node in the path, to which the bias voltage is not applied, within the path between the input matching circuit 20 and the amplifier 40. In the present embodiment, the protection circuit 30 is connected to the node N1 in the path between the amplifier 40 and the capacitor 12 for interrupting the bias voltage. Since no bias voltage is applied to the node N1, the voltage of the input signal to be applied to the node N1 has an amplitude of about the same amount on both positive and negative sides. Therefore, the threshold voltage of each of the first diode 31 and the second diode 32 of the protection circuit 30 can be set to about the same amount. Therefore, the configurations of the first diode 31 and second diode 32 may be similar to each other, so it is possible to simplify the configuration of the protection circuit 30. Thus, it is possible to simplify the manufacturing process for the amplifier circuit 10 and also achieve low cost.

In the present embodiment, the first diode 31 and the second diode 32 are each a two-terminal diode containing silicon as a semiconductor material, and the amplifier transistor 41 closest to the input terminal of the amplifier 40 (that is, the amplifier input terminal PIN) is an FET containing silicon. Here, in a transistor used in an amplifier for a radio-frequency signal, a structure tends to be miniaturized to improve characteristics. Accordingly, the threshold voltage of an amplifier transistor decreases. For this reason, when a transistor having the same structure as such a transistor is used as a diode by diode-connecting the transistor, that is, by connecting the gate terminal (base terminal) of the transistor and the drain terminal or source terminal (emitter terminal or collector terminal) of the transistor, the threshold voltage of the transistor is often lower than the threshold voltage of a two-terminal diode using the same semiconductor material. For this reason, with this configuration, the threshold voltage of each of the first diode 31 and second diode 32 of the protection circuit 30 can be made higher than the threshold voltage of the amplifier transistor 41. Therefore, as compared to the case where a transistor similar to the amplifier transistor 41 is used as the first diode 31 and the second diode 32, the threshold voltage of each of the first diode 31 and the second diode 32 is increased, so a distortion of the input signal is easily reduced. Specifically, the threshold voltage of each of the first diode 31 and the second diode 32 may be set to about 0.7 V, and the threshold voltage of the amplifier transistor 41 may be set to about 0.3 V. With the protection circuit 30 including the thus configured first diode 31 and second diode 32, it is possible to suppress input of an overvoltage to the amplifier 40 including the amplifier transistor 41 and reduce a distortion of the input signal.

In the present embodiment, the first diode 31 and the second diode 32 are each made up of a single diode element. Alternatively, at least one of the first diode 31 and the second diode 32 may include a plurality of diode elements. When a plurality of diode elements is used in this way, it is possible to adjust the threshold voltage of each of the first diode 31 and the second diode 32 by adjusting the number of diode elements. In other words, the flexibility of the threshold voltage is improved, so it is possible to realize the further appropriate protection circuit 30 for the amplifier 40 and the input signal.

Second Embodiment

Figure 5:
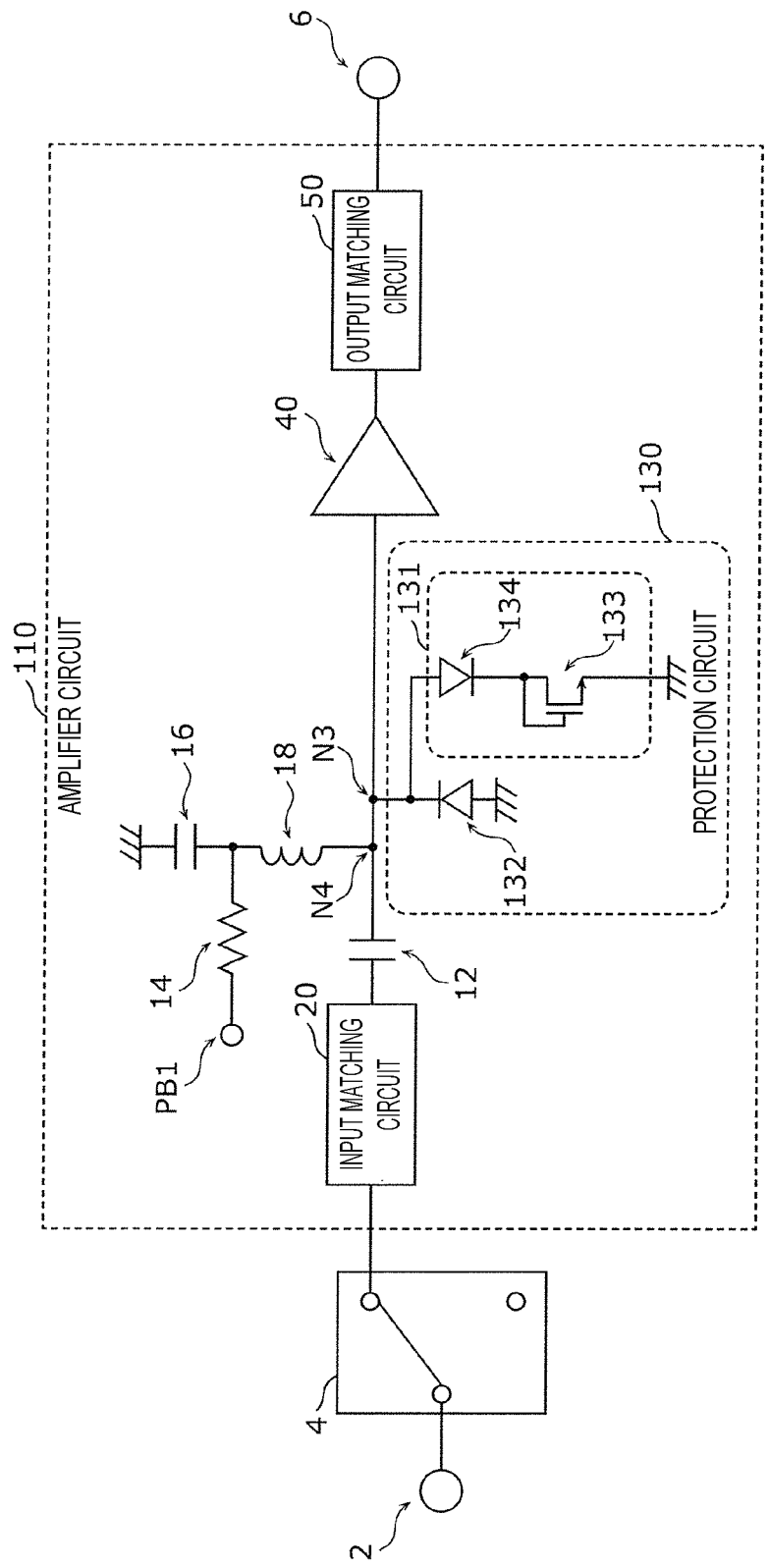
FIG. 5 is a schematic circuit diagram illustrating the configuration of an amplifier circuit according to a second embodiment.

An amplifier circuit according to a second embodiment will be described. The amplifier circuit according to the present embodiment differs from the amplifier circuit 10 according to the first embodiment in the connection position of the protection circuit and the circuit configuration of the protection circuit and is the same in the other points. Hereinafter, the amplifier circuit according to the present embodiment will be described with reference to FIG. 5 mainly on the differences from the amplifier circuit 10 according to the first embodiment. FIG. 5 is a schematic circuit diagram illustrating the configuration of an amplifier circuit 110 according to the present embodiment. FIG. 5, as well as FIG. 1, shows the input terminal 2, the switch 4, and the output terminal 6 together with the amplifier circuit 110.

As shown in FIG. 5, the amplifier circuit 110 includes the input matching circuit 20, a protection circuit 130, the amplifier 40, and the output matching circuit 50. As in the case of the amplifier circuit 10 according to the first embodiment, the output matching circuit 50 may be provided outside the amplifier circuit 110. The amplifier circuit 110 further includes the capacitor 12. FIG. 5 also shows a circuit between the amplifier 40 and the terminal PB1 to which a bias voltage is applied.

The bias voltage to be applied to the terminal PB1 is applied to a node N4 in the path between the capacitor 12 and the amplifier 40. An inductor 18, a resistance 14, and a capacitor 16 are connected between the terminal PB1 and the node N4. The inductor 18 is an element for increasing the impedance of the circuit that supplies the bias voltage against a radio-frequency signal. Thus, it is possible to suppress flow of a radio-frequency signal to the circuit that supplies the bias voltage and suppress a resistive component against the bias voltage that is a direct-current voltage. One terminal of the inductor 18 is connected to the node N4, and the other terminal is connected to one terminal of the capacitor 16. One terminal of the capacitor 16 is connected to the inductor 18, and the other terminal is connected to a ground. These capacitor 16 and inductor 18 are also elements that make up part of a matching circuit that matches the impedance of the amplifier circuit 110 when the amplifier circuit 110 is viewed from the input terminal 2 side. One terminal of the resistance 14 is connected to a connection point between the inductor 18 and the capacitor 16, and the other terminal is connected to the terminal PB1. The resistance 14 is a choke element for blocking flow of a radio-frequency signal to the terminal PB1 side. In the present embodiment, a bias voltage of about 0.5 V is applied to the terminal PB1.

As shown in FIG. 5, in the present embodiment, the protection circuit 130 is connected to a node N3 in the path between the amplifier 40 and the capacitor 12 for interrupting the bias voltage within the path between the input matching circuit 20 and the amplifier 40. In other words, the protection circuit 130 is connected to the node N3 in the path, to which the bias voltage is applied, within the path between the input matching circuit 20 and the amplifier 40. A voltage that is the sum of the input signal and the bias voltage applied to the terminal PB1 is applied to the node N3.

In the present embodiment, the protection circuit 130 includes a first diode 131 that is connected between the node N3 and the ground and that has a direction from the node N3 toward the ground as a forward direction, and a second diode 132 that is connected in parallel with the first diode 131 in a direction opposite to the first diode 131 between the node N3 and the ground. In other words, the anode of the first diode 131 and the cathode of the second diode 132 are connected to the node N3, and the anode of the second diode 132 and the cathode of the first diode are connected to the ground. Here, the first diode 131 includes a third diode 133 and a fourth diode 134 serially connected between the node N3 and the ground. The third diode 133 is connected to the ground, and the fourth diode 134 is connected between the node N3 and the third diode 133. As described above, the first diode 131 made up of a series circuit of the third diode 133 and the fourth diode 134 is connected in parallel with the second diode 132.

The first diode 131 and the second diode 132 are rectifier elements. In the present embodiment, the fourth diode 134, included in the first diode 131, and the second diode 132 are each a two-terminal diode, and the third diode 133 is a three-terminal diode, that is, a diode-connected transistor. In the present embodiment, the second diode 132 and the fourth diode 134 are each a two-terminal diode containing silicon.

In the present embodiment, the protection circuit 30 is connected to the node N3 in the path to which the bias voltage is applied, that is, the node N3 to which both the input signal and the bias voltage are applied, and the threshold voltage of the first diode 131 is higher than the sum of the maximum voltage amplitude of the input signal at the node N3 and the bias voltage that is applied to the terminal PB1. Thus, when a voltage lower than the maximum voltage amplitude of the input signal is applied to the protection circuit 130, the first diode 131 of the protection circuit 130 does not conduct. Therefore, when an overvoltage is not applied, the voltage of the input signal is not reduced by the protection circuit 130. In other words, with the amplifier circuit 110 according to the present embodiment, it is possible to reduce a distortion of the input signal as compared to the amplifier circuit described in, for example, Patent Document 1. On the other hand, when an overvoltage higher than or equal to the threshold voltage of each of the first diode 131 is applied to the amplifier circuit 110, it is possible to reduce the overvoltage applied to the amplifier 40 by conduction of the first diode 131.

The threshold voltage of the first diode 131 is less than the withstand voltage of the amplifier 40. Thus, the overvoltage reduced by the protection circuit 30 can be made constantly lower than the withstand voltage of the amplifier 40. Therefore, it is possible to reliably protect the amplifier 40 from overvoltage.

In the present embodiment, the third diode 133 includes a diode-connected transistor produced in the same process as the one or more amplifier transistors of the amplifier 40. The third diode is, for example, a diode-connected FET. The thus configured third diode 133 is made of the same material and formed on the same wafer as the one or more amplifier transistors of the amplifier 40. In the present embodiment, a silicon wafer is used as the wafer. Thus, the threshold voltage of the third diode may be set to a voltage substantially equal to the threshold voltage of the amplifier transistor 41 closest to the input terminal of the amplifier 40 among the one or more amplifier transistors of the amplifier 40. Here, since the bias voltage is a voltage substantially equal to the threshold voltage of the amplifier transistor 41, the threshold voltage of the third diode 133 may be substantially equal to the bias voltage with this configuration. With the thus configured third diode 133, it is possible to easily increase the threshold voltage of the first diode 131 by a numeric value substantially equal to the bias voltage by just adding the third diode 133 through, for example, production in the same process as the transistors of the amplifier 40. The protection ability of the protection circuit increases as a threshold for the protection circuit to operate becomes lower, so, with this configuration, the protection circuit 130 that reduces a distortion of the input signal with a good protection ability is obtained.

The third diode 133 includes a diode-connected transistor, and the gate length of the diode-connected transistor may be equal to the gate length of the amplifier transistor 41. Thus, it is possible to bring the threshold voltage of the third diode 133 further closer to the threshold voltage of the amplifier transistor 41. Therefore, the protection ability of the protection circuit 130 is further easily improved.

In the present embodiment, the fourth diode 134 and the second diode 132 are each made up of a single diode element. Alternatively, at least one of the fourth diode 134 and the second diode 132 may include a plurality of diodes. Thus, the flexibility of the threshold voltage of each of the fourth diode 134 and the second diode 132 is improved, so it is possible to realize the further appropriate protection circuit 130 for the amplifier 40 and the input signal. The third diode 133 may also include a plurality of diodes.

Other Embodiments

The amplifier circuit according to the present disclosure is described by way of the embodiments; however, the present disclosure is not limited to the above-described embodiments. The present disclosure also encompasses other embodiments implemented by combining selected components of the above-described embodiments, modifications obtained by applying various alterations that are conceived of by persons skilled in the art to the above-described embodiments without necessarily departing from the purport of the present disclosure, and various devices that include the amplifier circuit according to the present disclosure.

For example, in the above-described embodiments, a power supply circuit for applying the bias voltage is not included in the amplifier circuit. Alternatively, the amplifier circuit of the present disclosure may include a power supply circuit for applying the bias voltage.

In the above-described embodiments, silicon is illustrated as a semiconductor material contained in the transistors and the diodes. Alternatively, other known semiconductor materials may be used.

INDUSTRIAL APPLICABILITY

The amplifier circuit according to the present disclosure is usable in communication devices, such as smartphones and tablet terminals, as an amplifier circuit capable of protecting an amplifier from overvoltage and reducing a distortion of an input signal.

REFERENCE SIGNS LIST 2 input terminal
4 switch
6 output terminal
10, 110, 1010 amplifier circuit
12, 16, 44 capacitor
14, 43 resistance
18, 45, 46 inductor
20 input matching circuit
30, 130 protection circuit
31, 131 first diode
32, 132 second diode
40 amplifier
41, 42 amplifier transistor
50 output matching circuit
133 third diode
N1 node
PB1, PB2 terminal
PIN amplifier input terminal
POUT amplifier output terminal

The invention claimed is:
1. An amplifier circuit configured to amplify an input radio-frequency (RF) signal, the amplifier circuit comprising:
   an amplifier to which the input RF signal and a bias voltage are applied;
   an input matching circuit that is connected to an input side of the amplifier, and that is configured to match impedance; and
   a protection circuit that is connected to a node in a path between the input matching circuit and the amplifier, the bias voltage not being applied to the node,
   wherein the protection circuit comprises:
      a first diode that is connected between the node and ground, and
      a second diode that is connected in parallel with the first diode between the node and ground with an opposite forward direction than the first diode, and
   wherein a threshold voltage of each of the first diode and the second diode is greater than a maximum voltage amplitude of the input RF signal at the node, and is less than a difference between a withstand voltage of the amplifier and the bias voltage.
2. An amplifier circuit that amplifies an input radio-frequency (RF) signal that is a radio-frequency signal, the amplifier circuit comprising:
   an amplifier to which the input RF signal and a bias voltage are applied;
   an input matching circuit that is connected to an input side of the amplifier, and that is configured to match impedance; and a protection circuit that is connected to a node in a path between the input matching circuit and the amplifier, the bias voltage being applied to the node, wherein the protection circuit comprises:
- a first diode that is connected between the node and ground, and that has a forward direction from the node to ground, and
- a second diode that is connected in parallel with the first diode between the node and the ground with an opposite forward direction than the first diode, and wherein a threshold voltage of the first diode is greater than a sum of a maximum voltage amplitude of the input RF signal at the node and the bias voltage, and is less than a withstand voltage of the amplifier.

3. The amplifier circuit according to claim 1, wherein the first diode or the second diode comprises a plurality of diodes.

4. The amplifier circuit according to claim 2, wherein the first diode or the second diode comprises a plurality of diodes.

5. The amplifier circuit according to claim 3, wherein:
the first diode comprises a third diode and a fourth diode that are serially connected between the node and ground,
the third diode is connected to ground,
the fourth diode is connected between the node and the third diode,
the amplifier comprises one or more amplifier transistors, and
the third diode is a diode-connected transistor of the same material as the one or more amplifier transistors, and is on a same wafer as the one or more amplifier transistors.

6. The amplifier circuit according to claim 4, wherein:
the first diode comprises a third diode and a fourth diode that are serially connected between the node and ground,
the third diode is connected to ground,
the fourth diode is connected between the node and the third diode,
the amplifier comprises one or more amplifier transistors, and
the third diode is a diode-connected transistor of the same material as the one or more amplifier transistors, and is on a same wafer as the one or more amplifier transistors.

7. The amplifier circuit according to claim 5, wherein:
the amplifier comprises one or more amplifier transistors, and
a threshold voltage of the third diode is equal to a threshold voltage of an amplifier transistor of the one or more amplifier transistors that is closest to an input terminal of the amplifier.

8. The amplifier circuit according to claim 6, wherein:
the amplifier comprises one or more amplifier transistors, and
a threshold voltage of the third diode is equal to a threshold voltage of an amplifier transistor of the one or more amplifier transistors that is closest to an input terminal of the amplifier.

9. The amplifier circuit according to claim 5, wherein:
the third diode is a diode-connected field effect transistor (FET),
an amplifier transistor of the one or more amplifier transistors that is closest to an input terminal of the amplifier is an FET, and
a gate length of the diode-connected FET is equal to a gate length of the FET closest to the input terminal.

10. The amplifier circuit according to claim 6, wherein:
the third diode is a diode-connected field effect transistor (FET),
an amplifier transistor of the one or more amplifier transistors that is closest to an input terminal of the amplifier is an FET, and
a gate length of the diode-connected FET is equal to a gate length of the FET closest to the input terminal.

11. The amplifier circuit according to claim 1, wherein:
the first diode and the second diode are two-terminal diodes comprising silicon,
the amplifier comprises one or more amplifier transistors, and
an amplifier transistor of the one or more amplifier transistors that is closest to an input terminal of the amplifier is a field effect transistor (FET) comprising silicon.

12. The amplifier circuit according to claim 2, wherein:
the first diode and the second diode are two-terminal diodes comprising silicon,
the amplifier comprises one or more amplifier transistors, and
an amplifier transistor of the one or more amplifier transistors that is closest to an input terminal of the amplifier is a field effect transistor (FET) comprising silicon.

13. The amplifier circuit according to claim 5, wherein:
the second diode and the fourth diode are two-terminal diodes comprising silicon, and
an amplifier transistor of the one or more amplifier transistors that is closest to an input terminal is a field effect transistor (FET) comprising silicon.

14. The amplifier circuit according to claim 6, wherein:
the second diode and the fourth diode are two-terminal diodes comprising silicon, and
an amplifier transistor of the one or more amplifier transistors that is closest to an input terminal is a field effect transistor (FET) comprising silicon.

* * * * *